(12) United States Patent
Shim et al.

(10) Patent No.: US 12,234,176 B2
(45) Date of Patent: Feb. 25, 2025

(54) COVER GLASS AND METHOD FOR FABRICATING THE SAME

(71) Applicant: Samsung Display Co., LTD., Yongin-si (KR)

(72) Inventors: Byoung Yul Shim, Hwaseong-si (KR); Jung A Lee, Hwaseong-si (KR); Jae Seung Jeon, Hwaseong-si (KR); Beom Gyu Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/454,986

(22) Filed: Aug. 24, 2023

(65) Prior Publication Data

US 2023/0391663 A1 Dec. 7, 2023

Related U.S. Application Data

(62) Division of application No. 16/906,581, filed on Jun. 19, 2020, now Pat. No. 11,773,012.

(30) Foreign Application Priority Data

Oct. 24, 2019 (KR) ........................ 10-2019-0132959

(51) Int. Cl.
*C03C 17/00* (2006.01)
*H05K 5/03* (2006.01)
*H05K 5/00* (2006.01)

(52) U.S. Cl.
CPC .............. *C03C 17/002* (2013.01); *H05K 5/03* (2013.01); *C03C 2218/119* (2013.01); *C03C 2218/33* (2013.01); *H05K 5/0017* (2013.01)

(58) Field of Classification Search
None
See application file for complete search history.

(56) References Cited

U.S. PATENT DOCUMENTS

| | | |
|---|---|---|
| 5,068,260 A | 11/1991 | Noguchi |
| 8,643,260 B1 | 2/2014 | Nemeth et al. |
| 10,209,546 B2 | 2/2019 | Chen et al. |
| 11,020,957 B2 | 6/2021 | Matsuda |
| 2013/0034670 A1 | 2/2013 | Hashimoto et al. |
| 2017/0150626 A1 | 5/2017 | Kim |
| 2017/0349473 A1* | 12/2017 | Moriya .................... B28D 1/14 |
| 2019/0031559 A1 | 1/2019 | Hori et al. |

FOREIGN PATENT DOCUMENTS

| | | |
|---|---|---|
| CN | 103395310 | 11/2013 |
| CN | 105643968 | 6/2016 |
| CN | 105977400 | 9/2016 |

(Continued)

*Primary Examiner* — Michael P. Rodriguez
(74) *Attorney, Agent, or Firm* — KILE PARK REED & HOUTTEMAN PLLC

(57) ABSTRACT

A method of fabricating a cover glass includes preparing a base member including a first area and a second area, wherein a surface of the base member is substantially parallel to a direction in the first area and is inclined with respect to the direction in the second area, and forming an ink layer on the surface of the base member in the second area, and forming a first print layer by removing a portion of the ink layer and forming a second print layer on the first print layer.

10 Claims, 27 Drawing Sheets

(56) References Cited

FOREIGN PATENT DOCUMENTS

| | | | |
|---|---|---|---|
| CN | 106708185 | 5/2017 | |
| CN | 106708185 A * | 5/2017 | ........... C03C 17/002 |
| CN | 106891633 | 6/2017 | |
| CN | 107414308 | 12/2017 | |
| CN | 108040142 | 5/2018 | |
| CN | 108116151 | 6/2018 | |
| CN | 108777923 | 11/2018 | |
| CN | 109733061 | 5/2019 | |
| CN | 208855257 | 5/2019 | |
| CN | 109955612 | 7/2019 | |
| CN | 110085649 | 8/2019 | |
| CN | 209381571 | 9/2019 | |
| JP | 2018-197850 | 12/2018 | |
| JP | 2019-98792 | 6/2019 | |
| KR | 10-1373142 | 3/2014 | |

* cited by examiner

COVER GLASS AND METHOD FOR FABRICATING THE SAME

CROSS REFERENCE TO RELATED APPLICATION(S)

This is a divisional application of U.S. patent application Ser. No. 16/906,581, filed Jun. 19, 2020 (now pending), the disclosure of which is incorporated herein by reference in its entirety. U.S. patent application Ser. No. 16/906,581 claims priority to and benefits of Korean Patent Application No. 10-2019-0132959 under 35 U.S.C. § 119, filed Oct. 24, 2019, in the Korean Intellectual Property Office (KIPO), the disclosure of which is incorporated herein by reference in its entirety for all purposes.

BACKGROUND

1. Technical Field

The disclosure relates to a cover glass and a method for fabricating the same, and, to a method for fabricating a cover glass, the method including forming a print layer in a curved region of a cover glass using pad-printing, laser, and exposure techniques, and the cover glass fabricated by the method.

2. Description of the Related Art

The importance of display devices has increased with the development of multimedia. Accordingly, various kinds of display devices such as an organic light emitting diode (OLED) display device and a liquid crystal display (LCD) device have been used. The fields to which such display devices may be applied, have diversified to various mobile electronic devices, for example, portable electronic devices such as a smartphone, a smartwatch, a laptop personal computer (PC), and tablet.

A transparent cover glass may be disposed in front of a display panel to allow a user to view a display in various display devices such as mobile devices. The display panel may be divided into a display area in which an actual image may be displayed and a non-display area defined by an area excluding the display area. The cover glass may also be divided into, according to the display panel, a light transmitting area corresponding to the display area and an opaque light shielding area corresponding to the non-display area. A light shielding member may be disposed, or a predetermined ink may be printed, to partially block light emitted from the display panel in the opaque light shielding area of the cover glass.

The importance of display devices having a partially inclined or rounded display surface continues to increase. For example, by forming a surface of a front cover glass, which forms an exterior of a display device, to be partially rounded, the aesthetic appeal of the display device and tactile appeal to a user may be improved.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a method of fabricating a cover glass, the method including forming a print layer in an inclined or rounded area.

Aspects of the disclosure also provide a cover glass fabricated using the method of fabricating a cover glass.

It should be noted that objects of the disclosure are not limited to the above-mentioned objects, and other objects of the disclosure will be apparent to those skilled in the art from the following descriptions.

According to an embodiment, a method of fabricating a cover glass may include preparing a base member including a first area and a second area, wherein a surface of the base member may be substantially parallel to a direction in the first area and may be inclined with respect to the direction in the second area, forming an ink layer on the surface of the base member in the second area, forming a first print layer by removing a portion of the ink layer; and forming a second print layer on the first print layer.

The forming of the ink layer may comprise transferring ink on the surface of the base member, and performing a first drying including drying the ink to form the ink layer.

The ink layer may include a first portion and a second portion connected to the first portion and disposed adjacent to the first area, and the forming of the first print layer may comprise removing the second portion of the ink layer.

The removing of the second portion of the ink layer may comprise irradiating the first portion with UV light, and etching the second portion to remove the second portion.

The removing of the second portion of the ink layer may comprise directly irradiating the second portion with a laser.

The laser may be irradiated toward the second portion from an upper portion of the surface of the base member.

The laser may be irradiated toward the second portion from another surface of the base member that may be disposed at an opposite side of the surface.

The forming of the second print layer may be performed after removing of the second portion of the ink layer.

The removing of the second portion of the ink layer may be performed after forming the second print layer.

The method of fabricating a cover glass may include performing a second drying including drying the first print layer and the second print layer after the forming of the second print layer.

The second drying may be performed at a higher temperature than the first drying.

The method may include bending the base member downward from the first area to have a third area in which a portion of the base member may face another surface of the base member that may be disposed at an opposite side of the surface.

The first print layer may be disposed at the portion of the base member facing the another surface in the third area.

The forming of the first print layer may include, irradiating the ink layer with a laser from a side surface of the third area to remove at least a portion of the ink layer.

According to an embodiment, a cover glass may comprise a base member including a first area and a second area adjacent to the first area wherein a surface of the base member may be substantially parallel to a direction in the first area and may be inclined with respect to the direction in the second area, a first print layer disposed on the surface of the base member in the second area, and a second print layer disposed on the first print layer and spaced apart from a side surface of the first print layer, the side surface of the first print layer being adjacent to the first area, wherein at least part of the side surface of the first print layer may be recessed toward the second print layer.

A width of the first print layer may be larger than a width of the second print layer.

A thickness of the first print layer may be smaller than a thickness of the second print layer.

The at least part of the side surface of the first print layer may include a lower end portion that may be inwardly recessed and in direct contact with the base member.

The first print layer and the second print layer may extend along a side of the base member, and a side of the first print layer adjacent to the first area may have a partially curved shape.

The base member may include a third area in which the base member may be bent downward from the first area, a portion of the base member may face another surface of the base member in the third area, the another surface of the base member being disposed at an opposite side of the surface of the base member, and the first print layer may be disposed at the portion of the base member facing the another surface in the third area.

BRIEF DESCRIPTION OF THE DRAWINGS

The above and other aspects and features of the disclosure will become more apparent by describing embodiments thereof in detail with reference to the attached drawings, in which.

DETAILED DESCRIPTION OF THE EMBODIMENTS

Figure 1:
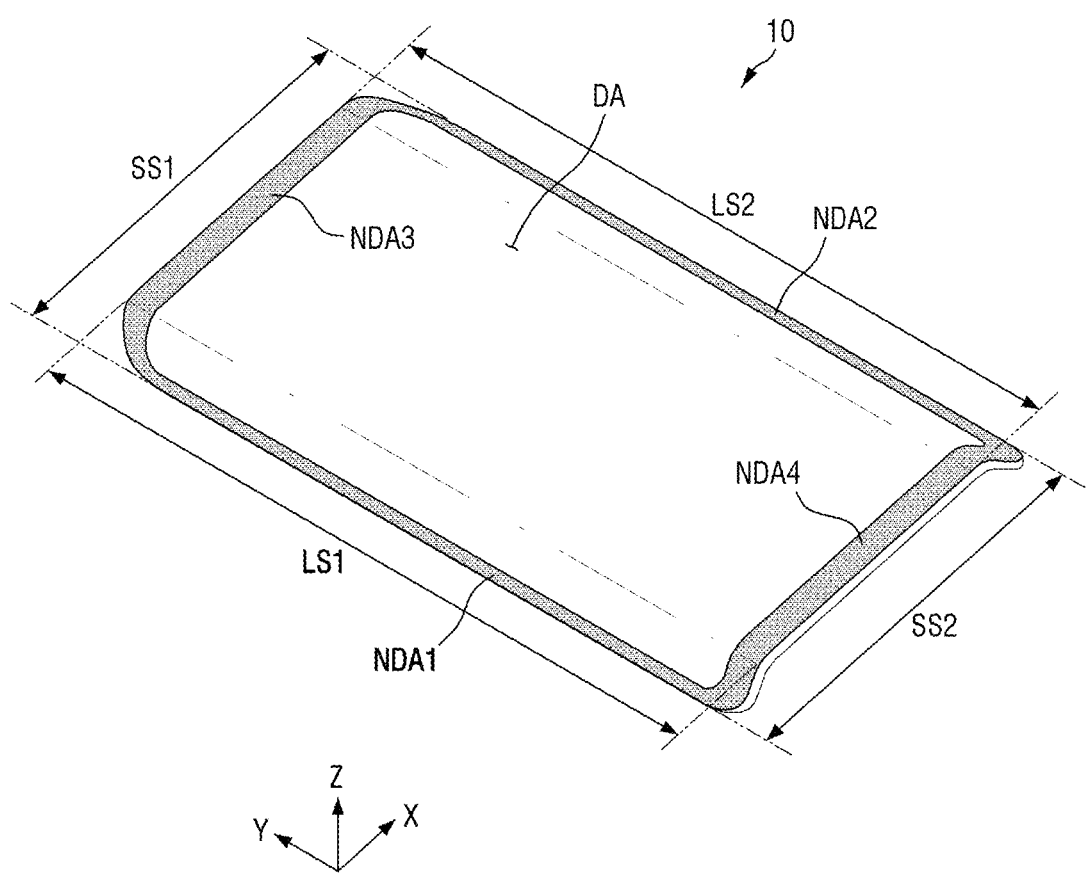
FIG. 1 is a perspective view illustrating a cover glass according to an embodiment.

The disclosure will now be described more fully hereinafter with reference to the accompanying drawings, in which embodiments are described. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Some of the parts which are not associated with the description may not be provided in order to describe embodiments of the disclosure and like reference numerals refer to like elements throughout the specification.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

In the drawings, sizes and thicknesses of elements may be enlarged for better understanding, clarity, and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

Figure 2:
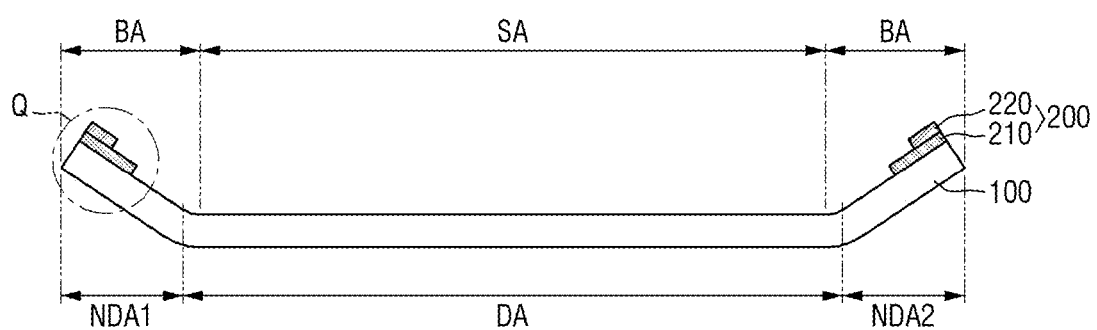
FIG. 2 is a schematic cross-sectional view of a cover glass according to an embodiment.

FIG. 1 is a perspective view illustrating a cover glass according to an embodiment. FIG. 2 is a schematic cross-sectional view of the cover glass according to an embodiment.

In the specification, "upper portion," "top," and "upper surface" may indicate a Z-axis direction, and "lower portion," "bottom," and "lower surface" may indicate an opposite direction of the Z-axis direction. Additionally, "leftward," "rightward," "upward," and "downward" may indicate directions when a cover glass 10 may be viewed from a plane. For example, "leftward" may indicate an opposite direction of an X-axis direction, "rightward" may indicate the X-axis direction, "upward" may indicate a Y-axis direction, and "downward" may indicate an opposite direction of the Y-axis direction.

FIG. 2 illustrates a schematic cross-section of the cover glass 10 of FIG. 1 that is taken in a first direction (X-axis direction) and illustrates a perspective in which a lower surface, which is a surface in a third direction (Z-axis direction), of the cover glass 10 may be disposed to face upward in the drawing.

Referring to FIGS. 1 and 2, the cover glass 10 may be formed in a substantially rectangular shape in a plan view. For example, as illustrated in FIG. 1, the cover glass 10 may have, in the plan view, a substantially rectangular shape having short sides in the first direction (X-axis direction) and long sides in a second direction (Y-axis direction). A corner where the short side in the first direction (X-axis direction) and the long side in the second direction (Y-axis direction) meet may be formed to be right-angled or formed to be rounded with a predetermined curvature. However, the shape of the cover glass 10 in the plan view is not limited to the substantially rectangular shape, and may also be any polygonal shape, a circular shape, or an elliptical shape within the spirit and the scope of the disclosure. A display member (not shown) may be formed to be flat. However, the disclosure is not limited thereto. At least a side of the display member may be formed to be bent with a predetermined curvature.

The cover glass 10 may include a base member 100 and a print layer 200 disposed on at least a portion or a part of the base member 100.

The base member 100 may be a base material forming a basic frame of the cover glass 10. The base member 100 may be formed of a substance made of a transparent material. For example, the base member 100 may be formed including glass or plastic. When the base member 100 of the cover glass 10 includes a plastic material, the cover glass 10 may have a property of being flexible, bendable, or rollable. Accordingly, the cover glass 10 may not necessarily be of glass, but may include any other suitable material within the spirit and the scope of the disclosure. Hereinafter, the cover glass 10 will generally be referred to as a cover glass 10.

Examples of plastic applicable to the base member 100, although not limited thereto, include polyimide, polyacrylate, polymethylmethacrylate (PMMA), polycarbonate (PC), polyethylenenaphthalate (PEN), polyvinylidene chloride, polyvinylidene difluoride (PVDF), polystyrene, ethylene vinylalcohol copolymer, polyethersulphone (PES), polyetherimide (PEI), polyphenylene sulfide (PPS), polyallylate, tri-acetyl cellulose (TAC), and cellulose acetate propionate (CAP).

When the base member 100 includes plastic, the cover glass 10 may include a coating layer (not illustrated) disposed at upper and lower surfaces of the plastic. In an embodiment, the coating layer may be a hard coating layer including an organic layer and/or an organic-inorganic composite layer that may include an acrylate compound or the like within the spirit and the scope of the disclosure. The organic layer may include an acrylate compound. The organic-inorganic composite layer may be a layer in which an inorganic substance, such as silicon oxide, zirconium oxide, aluminum oxide, tantalum oxide, niobium oxide, glass beads or the like, is dispersed in an organic substance such as an acrylate compound. In an embodiment, the coating layer may include a metal oxide layer. The metal oxide layer may include a metal oxide such as titanium, aluminum, molybdenum, tantalum, copper, indium, tin, tungsten or the like, but the disclosure is not limited thereto.

The base member 100 may have substantially the same shape as the cover glass 10, and members disposed on the base member 100 may constitute a single cover glass 10 together with the base member 100. For example, the base member 100 may be formed in a substantially rectangular shape in the plan view. For example, the base member 100 may have a substantially rectangular shape with right-angled corner portions or a substantially rounded rectangular shape with rounded corner portions in the plan view.

In this case, the base member 100 may include long sides LS1 and LS2 which may face substantially parallel to each other and extend in the second direction (Y-axis direction) and short sides SS1 and SS2 which may face substantially parallel to each other and extend in the first direction (X-axis direction). For convenience of description, with reference to FIG. 1, the left long side in the plan view may be referred to as "first long side LS1," the right long side in the plan view may be referred to as "second long side LS2," the upper short side in the plan view may be referred to as "first short side SS1," and the lower short side in the plan view may be referred to as "second short side SS2." In an embodiment, the length of the long sides LS1 and LS2 of the base member 100 may be longer than the length of the short sides SS1 and SS2 and may be in a range of about 1.5 to about 2.5 times the length of the short sides SS1 and SS2. However, the disclosure is not limited thereto.

As illustrated in FIGS. 1 and 2, the base member 100 may include a flat area formed on one surface and a curved area formed at outer side portions of the flat area to be inclined or rounded.

According to an embodiment, the base member 100 may include a first area SA that may be horizontal to the first direction (X-axis direction) and a second area BA that may have, unlike the first area SA, a surface formed to be inclined or rounded instead of being flat. The first area SA of the base member 100 may be a flat area in which one surface may have a flat surface, and the second area BA may be a curved area in which one surface may be inclined or rounded instead of being flat. The first area SA may be located or disposed at a central portion of the base member 100, and the second area BA may be located or disposed at outer side portions of the first area SA, for example, both sides of the first area SA in the first direction (X-axis direction). Accordingly, there may be at least two second areas BA. Accordingly, the cover glass 10 may substantially have the shape in which a central portion of one surface may be flat and left and right outer side portions thereof may be partially inclined or rounded.

However, the disclosure is not limited thereto, and the base member 100 of the cover glass 10 may also have a shape in which, not only the left and right sides, but also upper and lower sides may be inclined or rounded. In this case, the second area BA of the base member 100 may be formed to surround the first area SA or to be adjacent to the first area SA. As an example, the base member 100 of the cover glass 10 may have a shape in which one surface may be flat as a whole without outer side portions thereof being rounded or may have a shape in which the outer side portions may be bent such that a portion of one surface of the second area BA of the base member 100 and a portion of one surface of the first area SA may be disposed to face each other. This will be described in more detail below when describing an embodiment.

The print layer 200 may be disposed at another surface of the base member 100 in the third direction (Z-axis direction), for example, a lower surface of the base member 100. The print layer 200 may include a substance that absorbs light advancing toward the base member 100 or blocks transmission of the light. In this way, light incident on the print layer 200 may be blocked.

In the specification, "one surface" of the base member 100 may refer to one surface in the third direction (Z-axis direction) on which the print layer 200 may not be formed, for example, an upper surface of the base member 100, and "the other surface" of the base member 100 may refer to the surface that is opposite to the one surface and may have the print layer 200 formed thereon, for example, the lower surface of the base member 100. From this point of view, the one surface and the other surface may be defined in each of the first area SA and the second area BA of the base member 100, the one surface of each of the first area SA and the second area BA may refer to a portion of the upper surface of the base member 100 on which the print layer 200 may not be formed, and the other surface of each of the first area SA and the second area BA may refer to a portion of the lower surface of the base member 100 on which the print layer 200 may be formed.

Accordingly, the cover glass 10 may include a light shielding area NDA, which may be an area in which the print layer 200 may be disposed on the base member 100, and a display area DA which may be an area excluding the light shielding area NDA. For example, the light shielding area NDA of the cover glass 10 may be defined according to the arrangement of the print layer 200 on the base member 100, and rays of light toward the base member 100 may be displayed through the display area DA.

In an embodiment, the print layer 200 may be disposed along an outer boundary portion of the base member 100 such that the light shielding area NDA may be disposed in the form of surrounding the display area DA. The print layer 200 may be disposed along the both long sides LS1 and LS2 and the both short sides SS1 and SS2 of the base member 100, and the light shielding area NDA may include a first light shielding area NDA1 and a second light shielding area NDA2 disposed adjacent to the both long sides LS1 and LS2 and a third light shielding area NDA3 and a fourth light shielding area NDA4 disposed adjacent to the both short sides SS1 and SS2.

The first light shielding area NDA1 may be disposed at one side of the cover glass 10 in the first direction (X-axis direction), for example, the left side of the cover glass 10, and the second light shielding area NDA2 may be disposed at the other side of the cover glass 10 in the first direction (X-axis direction), for example, the right side of the cover glass 10. The third light shielding area NDA3 may be disposed at one side of the cover glass 10 in the second direction (Y-axis direction), for example, the upper side of the cover glass 10, and the fourth light shielding area NDA4 may be disposed at the other side of the cover glass 10 in the second direction (Y-axis direction), for example, the lower side of the cover glass 10. For example, the first light shielding area NDA1 to the fourth light shielding area NDA4 may be formed to have a predetermined width, and the width of the third light shielding area NDA3 and the fourth light shielding area NDA4 may be thicker than the width of the first light shielding area NDA1 and the second light shielding area NDA2. However, the disclosure is not limited thereto.

The first light shielding area NDA1 may be formed with a relatively thin width such that an area of the display area DA of the cover glass 10 may increase in the first light shielding area NDA1. In this way, in the first light shielding area NDA1, a larger number of images may be simultaneously transmitted to a display device. The third light shielding area NDA3 may be formed with a relatively thick width such that a space in which other members included in the display device, such as a speaker or a camera, may be disposed may be secured or a logo, a pattern, or the like may be printed in the third light shielding area NDA3. In this way, the aesthetic appeal of the display device may be improved. However, the disclosure is not limited thereto, and, accordingly, at least a portion of the third light shielding area NDA3 may be concavely formed, and thus a portion of the third light shielding area NDA3 may have a narrower width.

According to an embodiment, the first light shielding area NDA1 and the second light shielding area NDA2 adjacent to the both long sides LS1 and LS2 of the base member 100 may extend in a longer length than the third light shielding area NDA3 and the fourth light shielding area NDA4 adjacent to the both short sides SS1 and SS2 in one direction. As described above, the cover glass 10 may include sides having different lengths. The first light shielding area NDA1 to the fourth light shielding area NDA4 disposed adjacent to the sides may have different lengths and extend in different directions.

As described above, the base member 100 may include the first area SA having a flat surface and the second area BA having an inclined or rounded surface. According to an embodiment, the first light shielding area NDA1 and the second light shielding area NDA2 of the cover glass 10 may be disposed on the second area BA, and the third light shielding area NDA3 and the fourth light shielding area NDA4 may be disposed on the first area SA. The light shielding area NDA may be formed by the print layer 200 disposed on the base member 100.

According to an embodiment, the print layer 200 may be disposed on a portion of the base member 100, and the light shielding area NDA may be formed in the area in which the print layer 200 may be disposed. For example, the print layer 200 may be disposed on the second area BA of the base member 100 in such a way that the print layer 200 may be disposed at the left and right sides with respect to the center of the base member 100, and the first light shielding area NDA1 and the second light shielding area NDA2 may be formed in the area in which the print layer 200 may be disposed on the second area BA. The print layer 200 may be disposed on the first area SA of the base member 100 in such a way that the print layer 200 may be disposed at the upper and lower sides with respect to the center of the base member 100, and the third light shielding area NDA3 and the fourth light shielding area NDA4 may be formed in an area in which the print layer 200 may be disposed on the first area SA while the display area DA may be formed in an area in which the print layer 200 may not be disposed.

FIG. 2 illustrates a schematic cross-section across the first light shielding area NDA1, the second light shielding area NDA2, and the display area DA. The print layer 200 may be disposed on a portion of the second area BA. Accordingly, the display area DA of the cover glass 10 may be formed to overlap portions of the first area SA and the second area BA of the base member 100.

Although not illustrated, the print layer 200 may be disposed on a portion of the first area SA of the base member 100, and the third light shielding area NDA3 and the fourth light shielding area NDA4 may be formed in the first area SA. Since the arrangement of the print layer 200 disposed on the first area SA may be substantially the same as that illustrated in FIG. 2, the print layer 200 disposed on the first light shielding area NDA1 and the second light shielding area NDA2 will be described in detail below.

Figure 3:
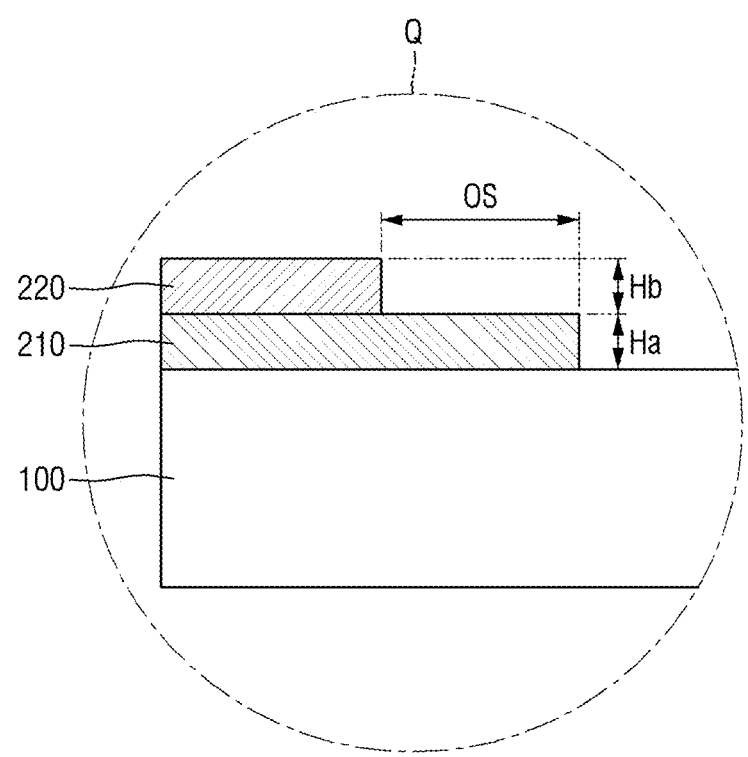
FIG. 3 is an enlarged view of portion Q of FIG. 2.

FIG. 3 is an enlarged view of portion Q of FIG. 2.

The print layer 200 will be described in more detail with reference to FIG. 3 in addition to FIG. 2. The print layer 200 may include a first print layer 210 and a second print layer 220.

The first print layer 210 may be disposed on the second area BA in such a way that the first print layer 210 may be disposed along one side of the base member 100. For example, in the second area BA, the first print layer 210 may be spaced apart from a boundary between the first area SA and the second area BA and disposed at an outer side portion of the base member 100. The first print layer 210 may be disposed directly on the base member 100, and the width of the light shielding area NDA of the cover glass 10 may be substantially the same as the width of the first print layer 210.

The second print layer 220 may be disposed on the first print layer 210. The second print layer 220 may include the same, or similar, material as the first print layer 210 and may be disposed on the first print layer 210. However, the second print layer 220 may be formed with a narrower width than the first print layer 210, and one side portion of the first print layer 210 may be disposed to protrude from one side portion of the second print layer 220. Thicknesses of the first print layer 210 and the second print layer 220 ("Ha" and "Hb" of FIG. 3) and the length ("OS" of FIG. 3) by which the one side portion of the first print layer 210 may protrude from the one side portion of the second print layer 220 are not particularly limited. For example, the thicknesses Ha and Hb of the first print layer 210 and the second print layer 220, respectively, may be in the range of about 3 μm to about 7 μm, and the length OS by which the one side portion of the first print layer 210 may protrude may be in the range of about 15 μm to about 20 μm.

The print layer 200 may be formed through a process of printing a predetermined ink on the base member 100. For example, the print layer 200 may be formed using a pad-printing technique in which ink containing a substance that absorbs light or blocks the transmission of light may be transferred onto a pad, and the ink may be printed on the base member 100. The pad-printing technique may be a technique of printing ink by a method in which ink may be transferred onto a target object, on which the ink may be printed, by contact between the target object and a pad. The ink transferred onto the pad may be printed on the target object according to surface energy between the pad-ink and the target object-ink in an area in which the pad and the target object may be in contact with each other.

Here, even when the same pad may be used, an error may occur in the shape or width of ink transferred onto the base member 100 according to each time the printing is performed. For example, when, in a process of forming the first print layer 210 using a pad, a contact area between the pad and the base member 100 may not be uniform when the pad and the base member 100 come in contact with each other and a different amount of ink may be transferred each time the printing is performed. An error may occur in the width of the first print layer 210 formed on the base member 100 each time the process is performed. For example, since, as described above, the first print layer 210 may be disposed directly on the one surface of the base member 100, and the width of the light shielding area NDA of the cover glass 10 may substantially vary according to the width of the first print layer 210, it may be necessary to minimize an error in the width of transferred ink according to the number of times the printing is performed when forming the print layer 200 using the pad-printing technique.

Since the base member 100 may include the second area BA in which one surface may be inclined or rounded instead of being flat, when the first print layer 210 is formed in the second area BA using the pad-printing technique, an error in the width of the first print layer 210 may be increased according to the shape of the base member 100.

According to an embodiment, a method of fabricating the cover glass 10 may include, in the process of forming the first print layer 210, a process of transferring ink and a process of removing a portion of the ink. In this way, it may be possible to form the first print layer 210 having a uniform width regardless of the shape of the base member 100 and improve the product quality by minimizing an error in the width of the first print layer 210 according to each printing technique.

Hereinafter, the method of fabricating the cover glass 10 according to an embodiment will be described.

Figure 4:
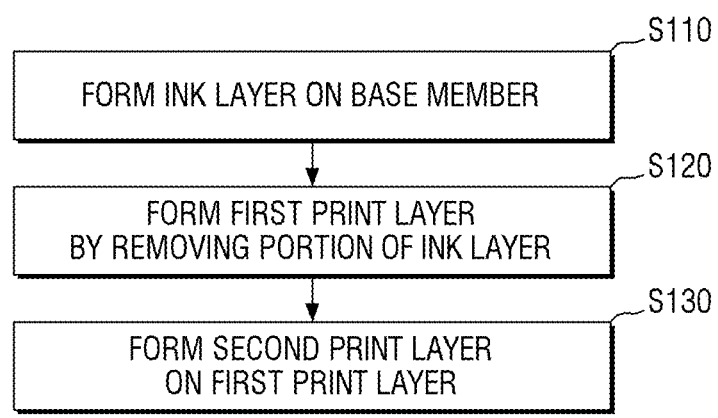
FIG. 4 is a flowchart illustrating a method of fabricating a cover glass according to an embodiment.

FIG. 4 is a flowchart illustrating a method of fabricating the cover glass according to an embodiment, and FIGS. 5 to 10 are schematic cross-sectional views illustrating a process of fabricating the cover glass according to an embodiment.

The method of fabricating the cover glass 10 according to an embodiment may comprise preparing the base member 100, which includes the first area SA in which one surface may be substantially parallel to the first direction (X-axis direction) and the second area BA in which the one surface may not be substantially parallel to the first direction (X-axis direction), and forming an ink layer in the second area BA of the one surface of the base member 100 and forming the first print layer 210, which may be formed by removing a portion of the ink layer, and the second print layer 220 disposed on the first print layer 210. The method of fabricating the cover glass 10 may include, in the process of preparing the base member 100 and forming the first print layer 210, forming the ink layer constituting the first print layer 210 by way of the pad-printing technique and forming the first print layer 210 by removing a portion of the ink layer so that the first print layer 210 may have a uniform width.

In more detail with reference to FIGS. 4 to 10, the method of fabricating the cover glass 10 may comprise forming an ink layer on the base member 100 (S110), removing a portion of the ink layer and forming the first print layer 210 (S120), and forming the second print layer 220 on the first print layer 210 (S130).

Figure 5:
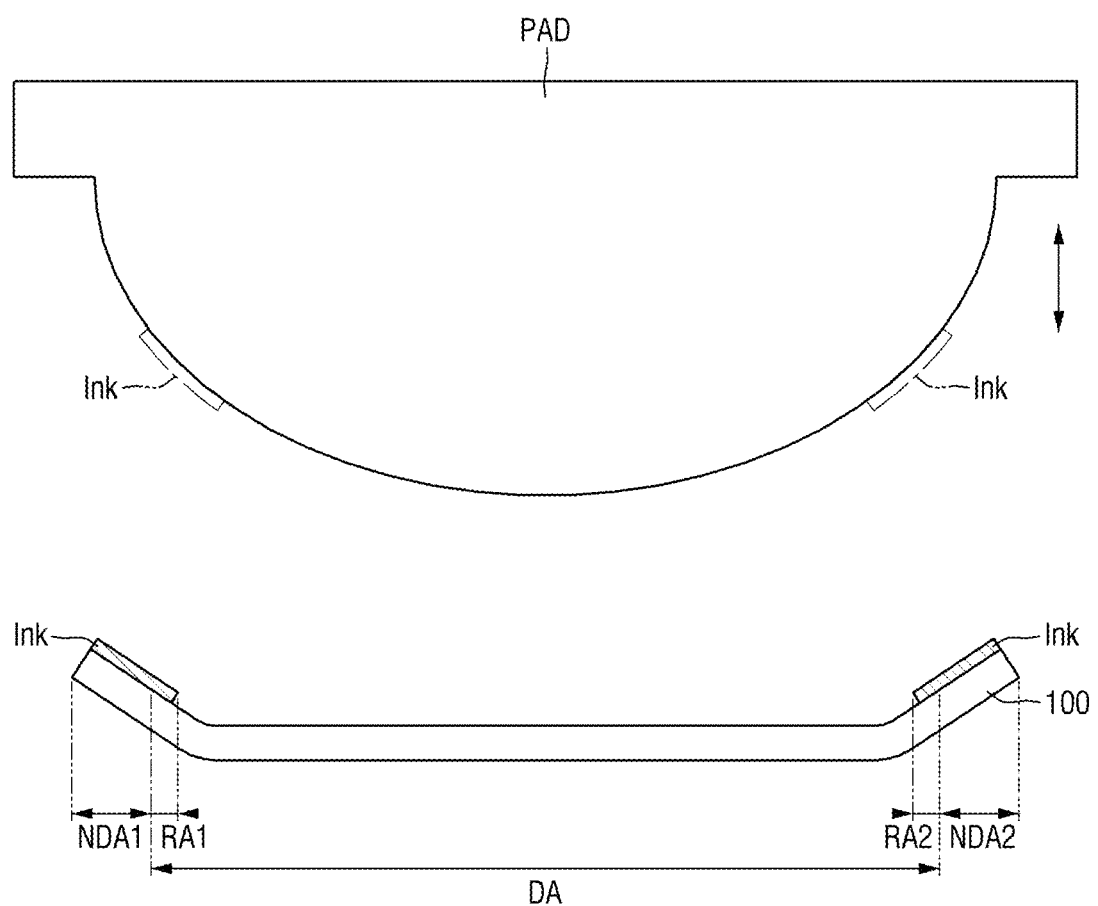
FIGS. 5 to 10 are schematic cross-sectional views illustrating a process of fabricating the cover glass according to an embodiment.
Figure 6:
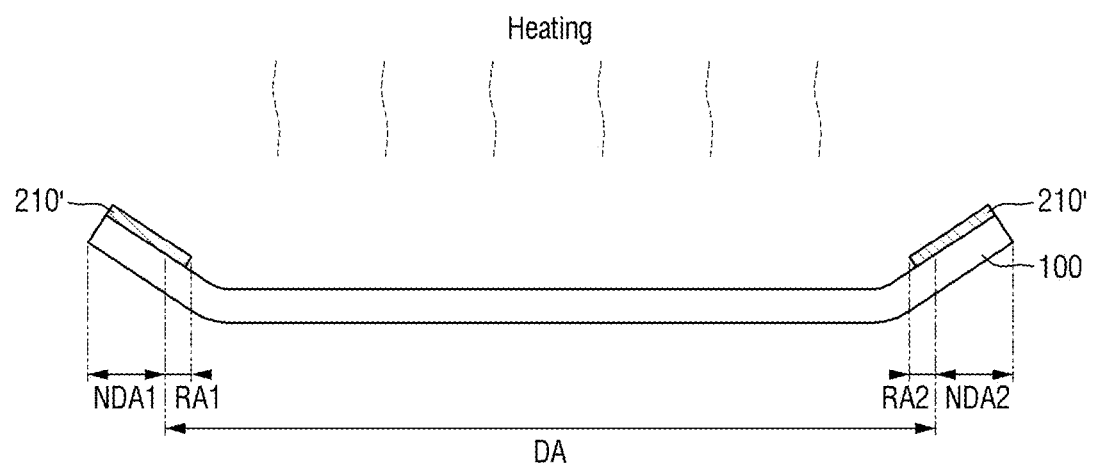

Referring to FIGS. 5 and 6, the base member 100 may be prepared, ink may be transferred onto one surface of the base member 100, and then, through a first drying step of drying the ink, an ink layer 210' may be formed. The ink may be transferred using the pad-printing technique using a pad PAD. As described above, the ink and the pad PAD may be brought into contact to transfer the ink onto the pad PAD, and then the base member 100 and the pad PAD may be brought into contact to transfer the ink onto the one surface of the base member 100. As illustrated in the drawings, the ink may be transferred onto the inclined or rounded area, for example, the second area BA, of the one surface of the base member 100.

In an embodiment, the ink may contain a substance that may absorb incident light or block the transmission of light. For example, the ink may be substantially formed of the same or similar substance as the print layer 200. The pad PAD may include a flexible substance whose shape may change due to an external force. Although not illustrated in the drawings, when the pad PAD and the base member 100 come in contact with each other, due to a compressive force, the pad PAD may expand in a direction perpendicular to the compressive force. Accordingly, an area in which the pad PAD and the base member 100 come into contact with each other may be larger than an area onto which the ink may be transferred. For example, the pad PAD may include a material such as silicone rubber. However, the disclosure is not limited thereto.

Then, the first drying step in which the ink may be dried through heat treatment may be performed to form the ink layer 210'. The ink may be a solution having fluidity. Thus, when a subsequent process is performed without drying the ink, the ink may be transferred onto the pad PAD again or the shape of the ink may be changed. To prevent this, the process of drying the ink and then forming the ink layer 210' may be performed. In an embodiment, the first drying step in which the ink may be dried to form the ink layer 210' may be performed in a temperature range of about 60° C. to about 80° C. However, the disclosure is not limited thereto.

Since a portion of the ink layer 210' may be removed to form the first print layer 210 in the subsequent process, the ink layer 210' may be formed to have a wider width than the first light shielding area NDA or the first print layer 210 of the cover glass 10. A portion of the ink layer 210' may be formed in the light shielding area NDA, and another portion of the ink layer 210' may be formed in removal areas RA1 and RA2. In the subsequent process, the ink layer 210' disposed on the removal areas RA1 and RA2 may be removed, and then the first print layer 210 may be formed.

Figure 7:
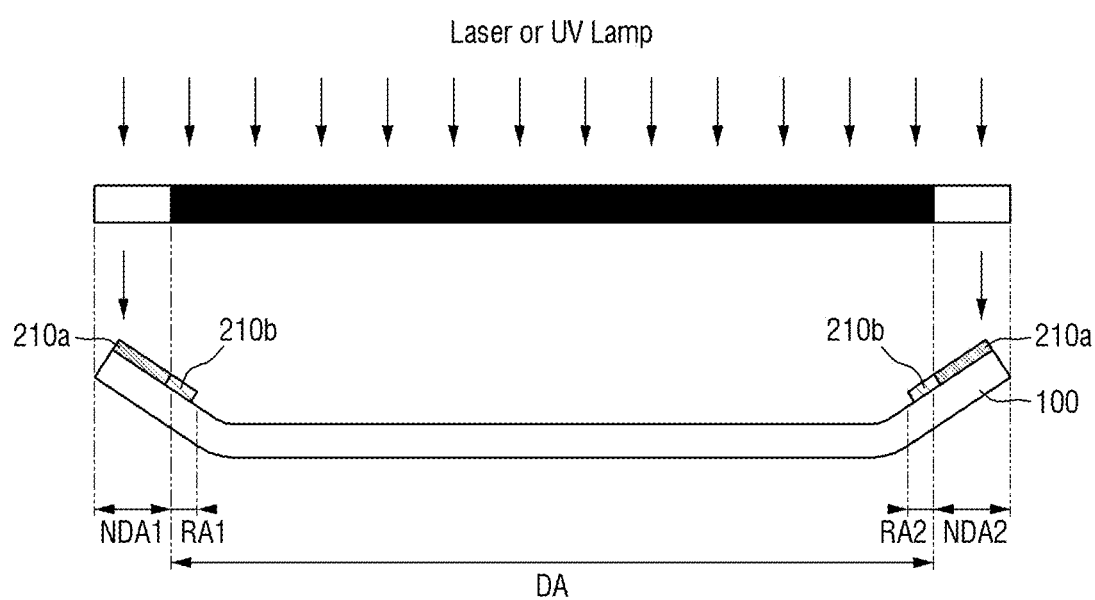
Figure 8:
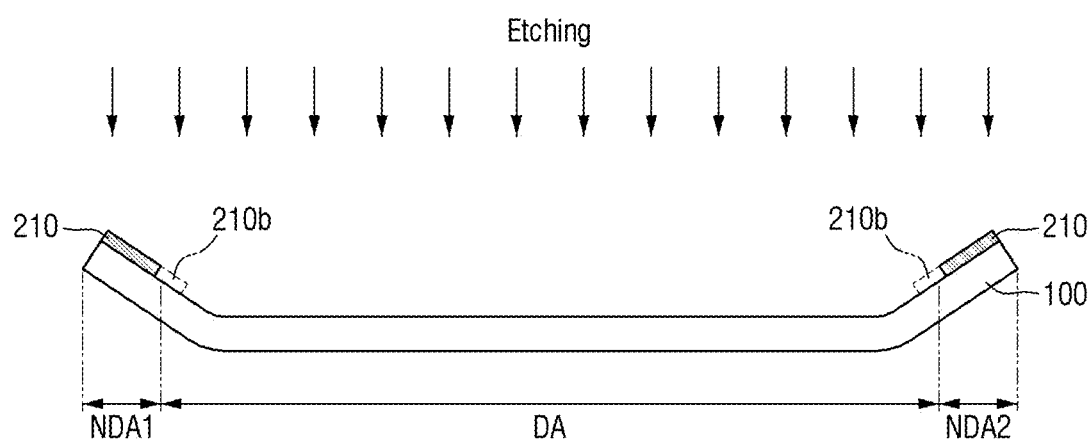
Figure 9:
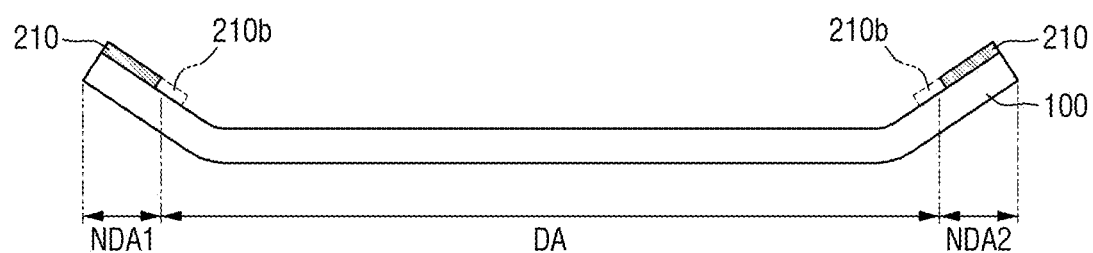

Then, referring to FIGS. 7 to 9, a portion of the ink layer 210' may be removed to form the first print layer 210. The ink layer 210' may include a first portion 210a which may remain, instead of being removed, and forms the light shielding area NDA in the subsequent process and a second portion 210b which may be disposed on the removal areas RA1 and RA2 and removed in the subsequent process. With reference to the drawings, the first portion 210a of the ink layer 210' that may be disposed at the left side of the display area DA may not be removed and form the first light shielding area NDA1, and the second portion 210b may be disposed on the first removal area RA1 and removed in the subsequent process. In the ink layer 210' disposed at the right side of the display area DA, the first portion 210a may not be removed and form the second light shielding area NDA2, and the second portion 210b may be disposed on the second removal area RA2 and removed in the subsequent process.

An error may occur in the width of the ink layer 210' formed on the one surface of the base member 100 using the pad-printing technique according to the number of times the printing may be performed. For example, when the second area BA of the base member 100 is curved further or completely bent, a significant error may occur in the process of transferring the ink through the pad-printing technique. To minimize the error in the width of the first print layer 210 formed according to the pad-printing technique, the method of fabricating the cover glass 10 according to an embodiment may comprise a process of forming the ink layer 210' in a width larger than that of the light shielding area NDA and then removing a portion of the ink layer 210'. In this way, it may be possible to form the first print layer 210 with a uniform width and improve the product quality by minimizing an error in the width of the first print layer 210 or the light shielding area NDA regardless of the shape of the second area BA of the base member 100.

Here, the method of removing the second portion 210b is not particularly limited, but, in an example, the process of removing the second portion 210b of the ink layer 210' may be formed through exposure and etching processes. As illustrated in FIGS. 7 and 8, by using a mask, only the first portion 210a of the ink layer 210' may be irradiated with light using a laser or a UV lamp, or generally, UV light or a UV light source, and the second portion 210b may not be irradiated with light. Accordingly, the hardness of the first portion 210a of the ink layer 210' may be increased as compared to that of the second portion 210b, and only the second portion 210b may be removed through the etching process afterwards.

However, the disclosure is not limited thereto. Accordingly, the second portion 210b disposed on the removal areas RA1 and RA2 may be irradiated with light using the laser or the UV lamp, or generally, UV light or a UV light source, and the second portion 210b may be removed through etching. In an embodiment, the second portion 210b of the ink layer 210' may be removed by being directly irradiated with a laser, for example.

As illustrated in FIG. 9, the first print layer 210 may be formed by removing the second portion 210b of the ink layer 210' through the above-described method. The first print layer 210 may be directly disposed on the one surface of the base member 100 and form the light shielding area NDA of the cover glass 10. Meanwhile, although the first print layer 210 is illustrated in the drawing as being formed on the first light shielding area NDA1 and the second light shielding area NDA2, the first print layer 210 may also be formed on the third light shielding area NDA3 and the fourth light shielding area NDA4 by using substantially the same method without departing from the spirit and the scope of the disclosure. Detailed descriptions thereof will be omitted.

Figure 10:
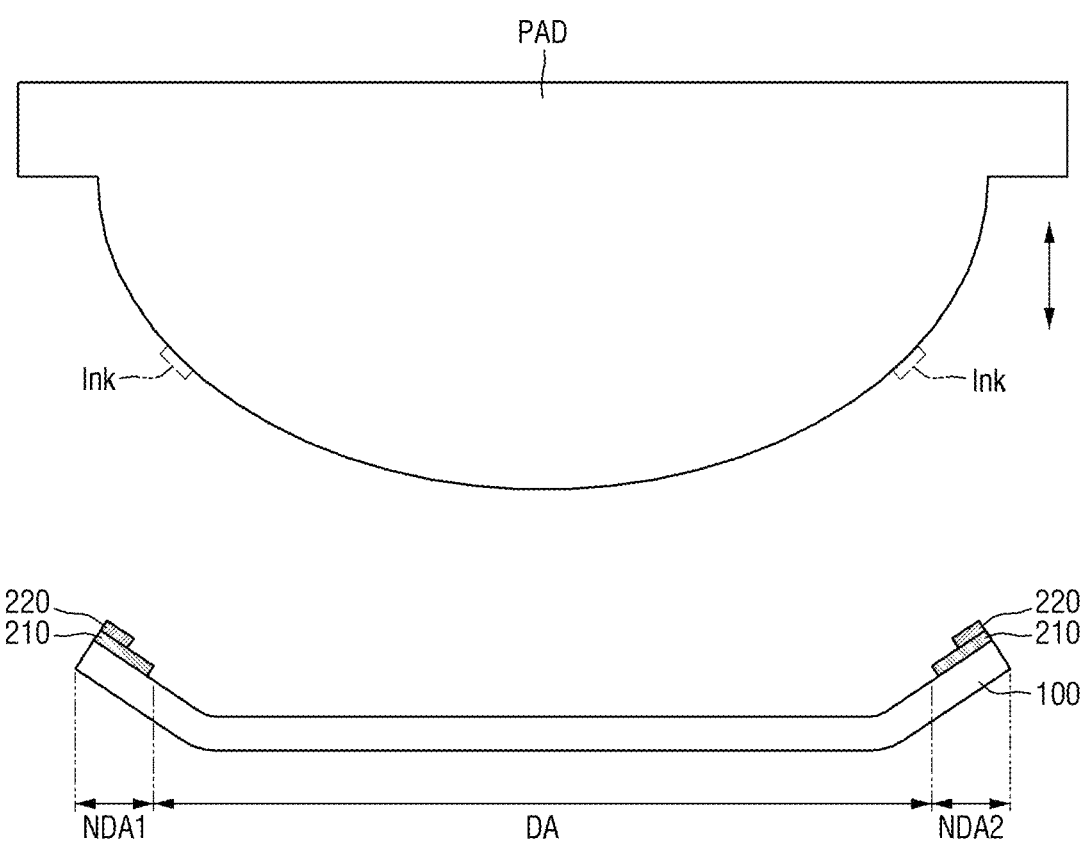

Then, referring to FIG. 10, the second print layer 220 may be formed on the first print layer 210. The method of forming the second print layer 220 may be substantially the same as the method of forming the ink layer 210'. The second print layer 220 may be formed through the method of transferring ink onto the first print layer 210 using the pad-printing technique. Although not illustrated in the drawings, the second print layer 220 may be formed by transferring the ink onto the first print layer 210 and then drying the ink through a second drying step. In an embodiment, the second drying step may be performed in a temperature range of about 150° C. to about 180° C. The second drying step for forming the second print layer 220 may be performed at a higher temperature than the first drying step for forming the ink layer 210'. In this way, the ink which may not be completely dried may be dried to form the print layer 200 including the first print layer 210 and the second print layer 220.

Although not illustrated, the method of forming the second print layer 220 is not limited to the above. In an embodiment, the second print layer 220 may also be formed through a printing technique other than the pad-printing technique, for example, a printing technique using a spray. The second print layer 220 may be formed through a process of spraying ink to a portion on the first print layer 210 using a spray. In this case, the second print layer 220 may be formed thicker than when it is formed through the pad-printing technique. In an embodiment, the second print layer 220 may be thicker than the first print layer 210, and the thickness of the second print layer 220 may be in a range of about 1.5 to about 2 times the thickness of the first print layer 210. When, as described above, the thickness of the first print layer 210 is in the range of about 3 μm to about 7 μm, the thickness of the second print layer 220 formed using the spraying technique may be in the range of about 8 μm to about 12 μm. However, the disclosure is not limited thereto.

The cover glass 10 according to an embodiment may be fabricated through the above-described method. The first print layer 210 disposed directly on the one surface of the base member 100 may be formed using the pad-printing technique in which ink may be transferred. The first print layer 210 may be formed to have a uniform width by performing the process of removing a portion of the ink layer 210'. The ink layer 210' may be formed to have a width wider than that necessary for the light shielding area NDA of the cover glass 10. By forming the first print layer 210 through the process of partially removing the ink layer 210', the light shielding area NDA may be formed in a desired width. Even when the shape of the second area BA of the base member 100 becomes complex, an error in the width of the first print layer 210, which may be formed through the pad-printing technique and the process of partially removing the ink layer 210', may be minimized.

Since, as described above, the process of forming the first print layer 210 may comprise removing a portion of the ink layer 210', a trace due to the removal of the portion of the ink layer 210' may be formed on the first print layer 210.

Figure 11:
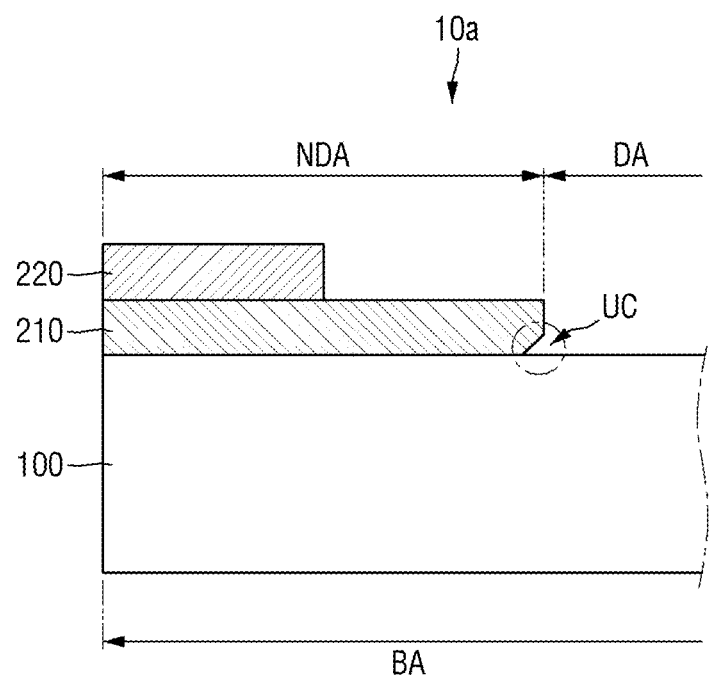
FIG. 11 is a schematic cross-sectional view illustrating a second area of the cover glass according to an embodiment.

FIG. 11 is a schematic cross-sectional view illustrating a second area of the cover glass according to an embodiment.

Referring to FIG. 11, at least a portion of one side surface adjacent to the display area DA, among side surfaces of a first print layer 210 of a cover glass 10a according to an embodiment, may have a recessed shape. The first print layer 210 may be formed by removing the second portion 210b of the ink layer 210', and the process of removing the second portion 210b of the ink layer 210' may be performed through the exposure and etching processes. Here, one surface of the first print layer 210 that may remain after the second portion 210b may be removed may be over-etched by an etching solution used in the etching process, and a partially recessed portion may be formed in the one surface of the first print layer 210.

As illustrated in the drawing, in the side surface adjacent to the display area DA among the side surfaces of the first print layer 210, a lower end portion coming in contact with the base member 100 may be recessed inward ("UC" in FIG. 10). The lower end portion that may be recessed inward may be formed due to the lower surface of the ink layer 210' being over-etched by the etching solution as compared with the upper surface of the ink layer 210' in the process of removing a portion of the ink layer 210'.

The process of removing the second portion 210b of the ink layer 210' may not necessarily be performed through the exposure and etching processes and may also be performed through other processes. According to an embodiment, the process of removing the second portion 210b of the ink layer 210' may be performed through a process of irradiating by a laser.

Figure 12:
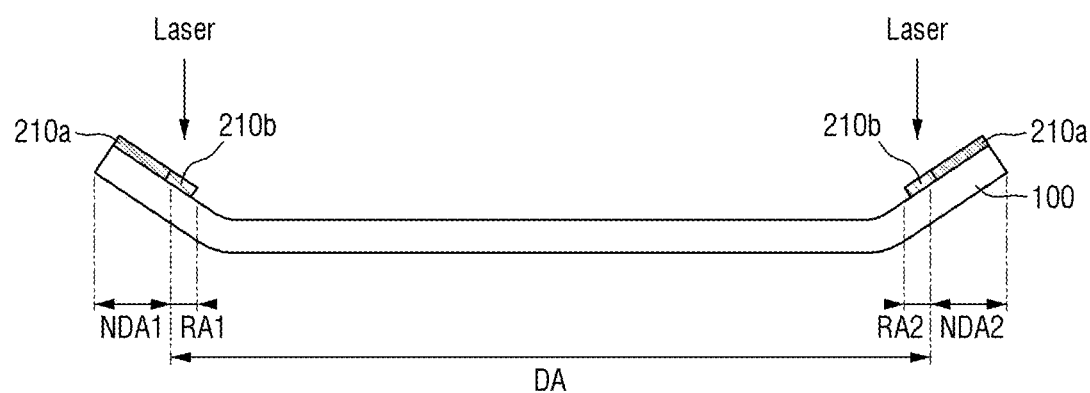
FIG. 12 is a schematic cross-sectional view illustrating a process of forming a first print layer according to an embodiment.

FIG. 12 is a schematic cross-sectional view illustrating a process of forming a first print layer according to an embodiment.

Referring to FIG. 12, a method of fabricating the cover glass 10 according to an embodiment may comprise removing the second portion 210b by irradiating the ink layer 210' with a laser. As illustrated in the drawing, in the process of forming the first print layer 210, only the second portion 210b of the ink layer 210' may be directly irradiated with the laser, and, in this way, the second portion 210b may be removed. A specific area to be removed, or only a specific area to be removed, may be selectively irradiated with the laser. Unlike the embodiment illustrated in FIGS. 7 and 8, even without using a separate mask, only the removal areas RA1 and RA2 may be selectively irradiated with the laser, and only the second portion 210b of the ink layer 210' may be removed.

Although the laser is illustrated in the drawing as being irradiated from the one surface of the base member 100, for example, the one surface on which the print layer 200 may be disposed, the disclosure is not limited thereto. According to an embodiment, in the forming of the first print layer 210, the laser irradiated to remove the second portion 210b of the ink layer 210' may also be irradiated from the other surface of the base member 100 to the removal areas RA1 and RA2.

Even when the first print layer 210 is formed through the process using the laser, at least a portion may have a recessed shape in the one side surface of the first print layer 210. However, unlike the embodiment illustrated in FIG. 11, a pattern that may be curved toward the inside of the first print layer 210 may be formed on one side surface of the first print layer 210 forming a boundary from the display area DA.

Figure 13:
FIG. 13 is a plan view illustrating a boundary between a display area and a light shielding area of a cover glass according to an embodiment.

FIG. 13 is a plan view illustrating a boundary between a display area and a light shielding area of a cover glass according to an embodiment.

Referring to FIG. 13, the cover glass 10 according to an embodiment may have a shape in which one side of the first print layer 210 may be curved ("LBS" of FIG. 13). The first print layer 210 and the second print layer 220 may extend along one side of the base member 100, and one side of the first print layer 210 that may be adjacent to the display area DA may form a boundary between the display area DA and the light shielding area NDA. When the ink layer 210' is irradiated with laser in the process of forming the first print layer 210, the ink layer 210' may be removed along the shape of the laser beam, and the first print layer 210 formed in this way may have a curved shape corresponding to the shape of the laser beam. Accordingly, the one side of the first print layer 210 adjacent to the display area DA may have a shape partially recessed toward the inside. However, the disclosure is not limited thereto.

The print layer 200 of the cover glass 10 may not necessarily be formed by forming the first print layer 210 and then forming the second print layer 220. For example, the process of removing the second portion 210b of the ink layer 210' may also be performed after the second print layer 220 may be formed.

Figure 14:
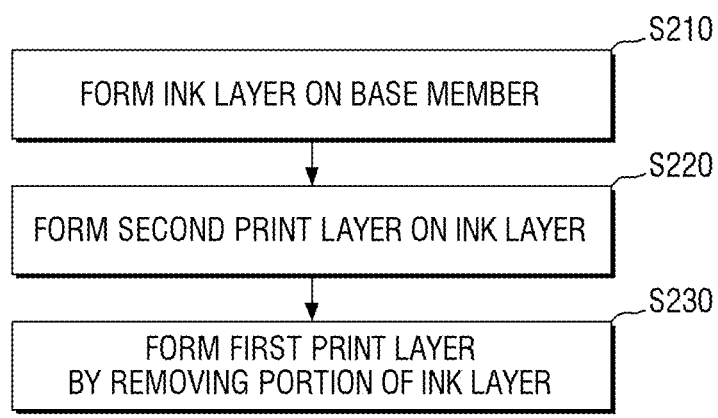
FIG. 14 is a flowchart illustrating a method of fabricating a cover glass according to an embodiment.
Figure 15:
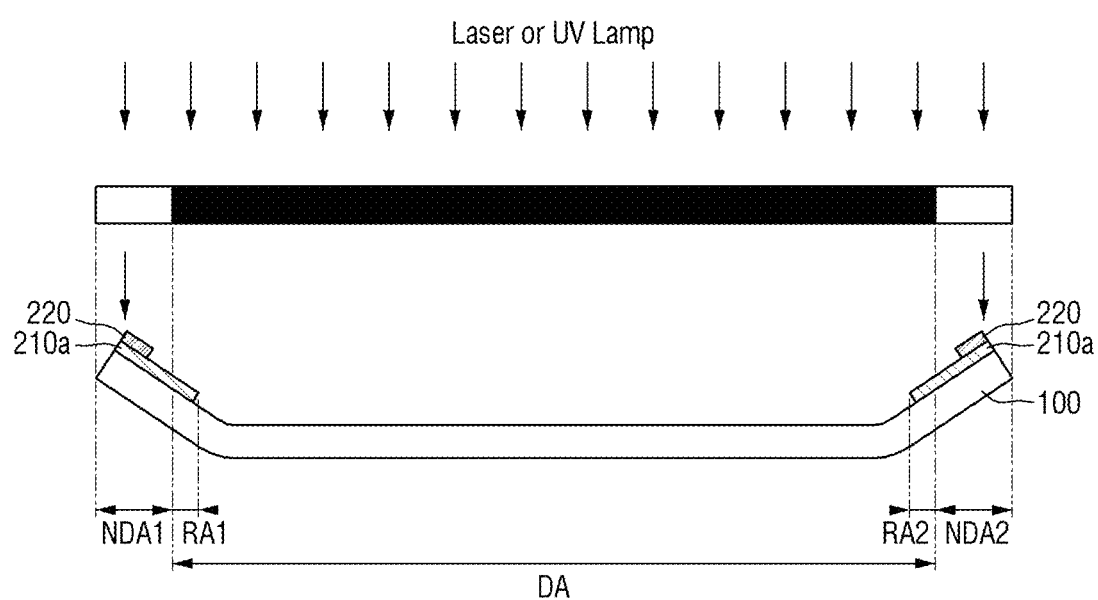
FIGS. 15 to 17 are schematic cross-sectional views illustrating a process of fabricating the cover glass according to an embodiment.
Figure 16:
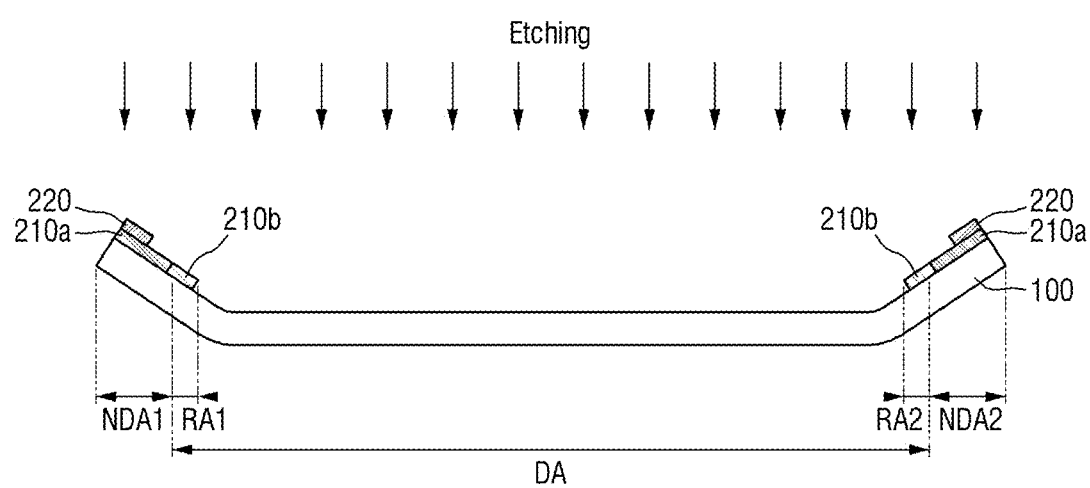
Figure 17:
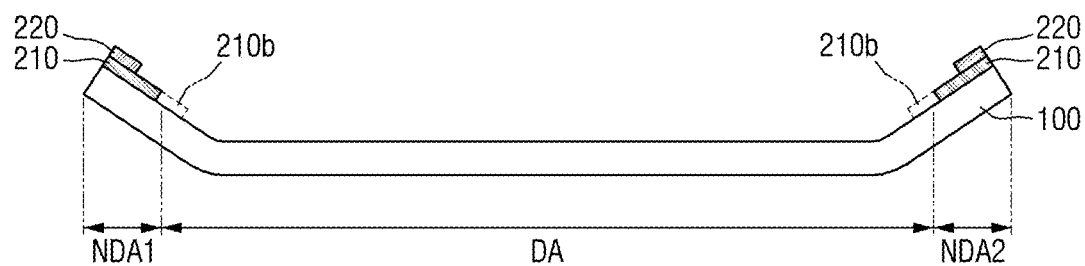

FIG. 14 is a flowchart illustrating a method of fabricating the cover glass according to an embodiment, and FIGS. 15 to 17 are schematic cross-sectional views illustrating a process of fabricating the cover glass according to an embodiment.

In an embodiment, the second print layer 220 may be directly formed on the ink layer 210', and then the second portion 210b of the ink layer 210' may be removed to form the first print layer 210. Referring to FIG. 14, the method of fabricating the cover glass 10 according to an embodiment may comprise preparing the base member 100 and forming the ink layer 210' on one surface of the base member 100 (S210), forming the second print layer 220 on the ink layer 210' (S220), and forming the first print layer 210 by removing a portion of the ink layer 210' (S230).

As described above, the width of the second print layer 220 may be substantially narrower than the width of the first print layer 210, and one side portion of the first print layer 210 may be disposed to protrude from the second print layer 220. Accordingly, even when the process of removing the portion of the ink layer 210' is performed after the second print layer 220 may be formed, only the ink layer 210' may be partially removed without causing damage to the second print layer 220.

Referring to FIG. 15, the ink layer 210' may be formed on one surface of the base member 100, the second print layer 220 may be formed on the ink layer 210', and then an exposure process may be performed in which an area excluding the ink layer 210' disposed on the removal areas RA1 and RA2 may be irradiated with light using a laser or a UV lamp or generally, UV light or a UV light source. Here, since the width of the second print layer 220 may be substantially narrower than the width of the ink layer 210', the second portion 210b of the ink layer 210' may be disposed to be spaced apart from the second print layer 220. Accordingly, in an embodiment, the irradiating with light using the laser or the UV lamp or generally, UV light or a UV light source, may be performed using the same method as the embodiment illustrated in FIG. 7.

Although not illustrated, after the second print layer 220 is formed, a drying step in which ink on the second print layer 220 may be dried may be performed before the irradiating with light using the laser or the UV lamp or generally, UV light or a UV light source. In this case, unlike the embodiment illustrated in FIG. 4, the drying step in which the second print layer 220 may be dried may be performed at a temperature similar to that at which the first drying step may be performed to form the ink layer 210'. For example, in the embodiment, the forming of the second print layer 220 may comprise the drying step performed in the temperature range of about 60° C. to about 80° C. However, the disclosure is not limited thereto.

Referring to FIGS. 16 and 17, the ink layer 210' disposed on the removal areas RA1 and RA2 that may not be irradiated with light using the laser or the UV lamp or generally, UV light or a UV light source, may be partially removed to form the first print layer 210. Although not illustrated in the drawings, a drying step in which ink on the first print layer 210 and the second print layer 220 may be dried may be performed. Since the drying step may be the same as that described above, detailed descriptions thereof will be omitted.

As described above, the process of removing the second portion 210b of the ink layer 210' may be performed by a process of removing the second portion 210b by directly irradiating the second portion 210b with a laser. The same may apply even when the second print layer 220 may be formed before the second portion 210b may be removed.

Figure 18:
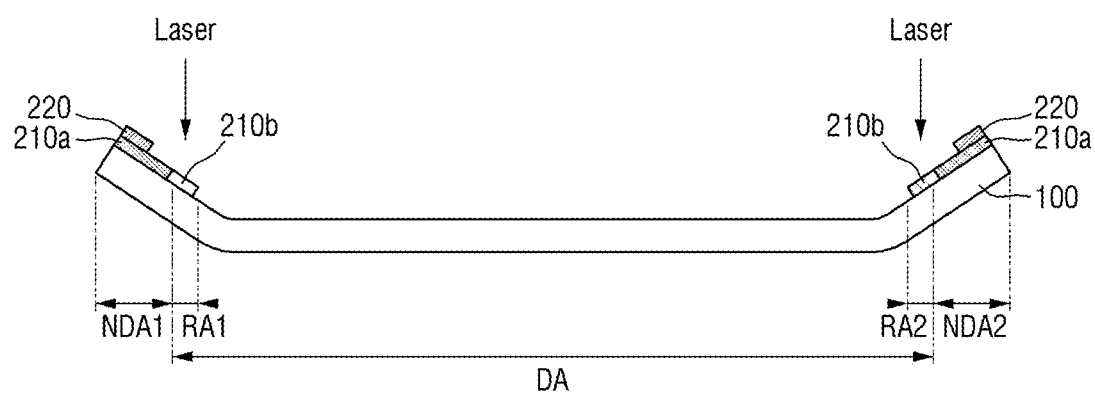
FIG. 18 is a schematic cross-sectional view illustrating a step or steps of the process of fabricating a cover glass according to an embodiment.

FIG. 18 is a schematic cross-sectional view illustrating a step or steps of the process of fabricating a cover glass according to an embodiment.

Referring to FIG. 18, the method of fabricating the cover glass 10 may comprise after forming the second print layer 220 on the ink layer 210', irradiating the second portion 210b of the ink layer 210' with laser to remove the second portion 210b. Since the second print layer 220 may be disposed to be recessed inward from one end portion of the first print layer 210, the second portion 210b of the ink layer 210' may be disposed to be spaced apart from the second print layer 220. Damage may not be caused to the second print layer 220 even when the process of directly removing the portion of the ink layer 210' may be performed using the laser after the second print layer 220 may be formed.

The cover glass 10 may comprise in addition to the first area SA having a flat surface and the second area BA having an inclined or rounded shape, an area that may be bent toward one side from the first area SA.

Figure 19:
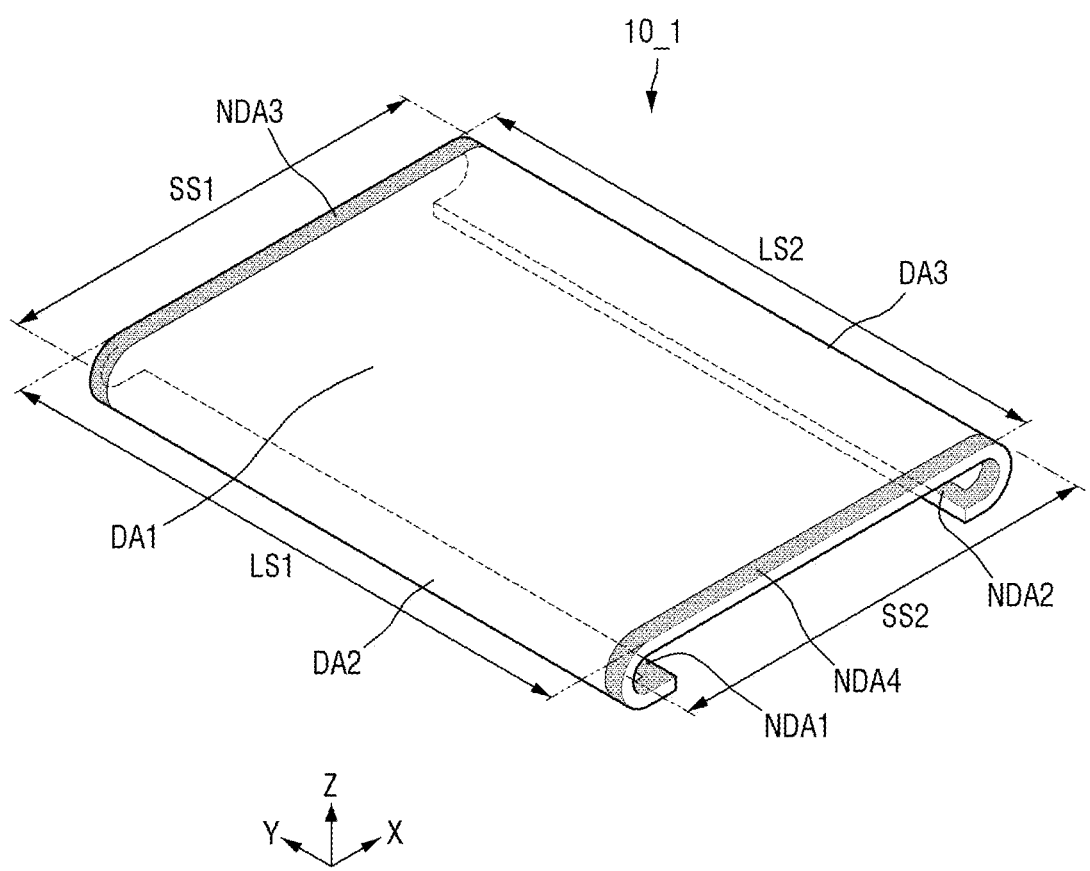
FIG. 19 is a perspective view illustrating a cover glass according to an embodiment.
Figure 20:
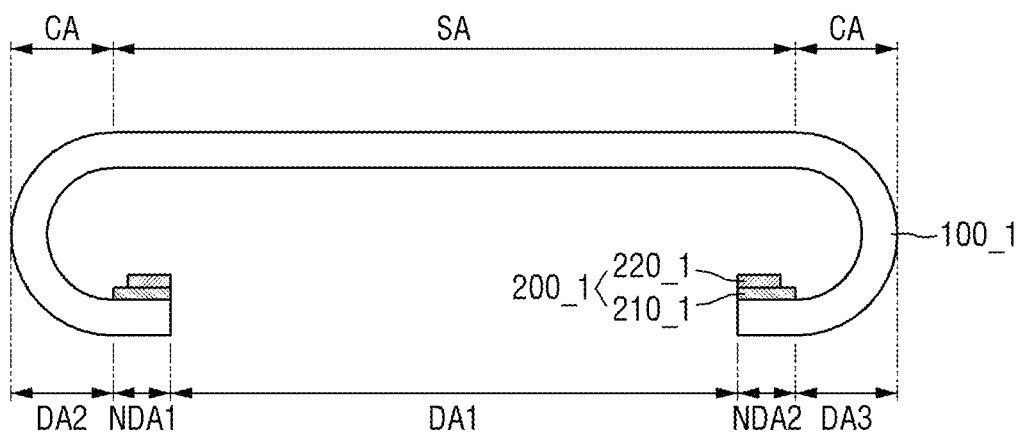
FIG. 20 is a schematic cross-sectional view of the cover glass of FIG. 19.

FIG. 19 is a perspective view illustrating a cover glass according to an embodiment, and FIG. 20 is a schematic cross-sectional view of the cover glass of FIG. 19.

Referring to FIGS. 19 and 20, a cover glass 10_1 according to an embodiment may include a third area CA or third areas CA in which a base member 100_1 may be bent downward from a first area SA and face the other surface of the first area SA. Unlike the embodiment illustrated in FIG. 1, in the cover glass 10_1 illustrated in FIG. 19, both sides of the first area SA having a flat surface, for example, a first long side LS1 and a second long side LS2 which may both be sides of the first area SA in the first direction (X-axis direction), may be bent downward and disposed to be spaced apart from the other surface of the first area SA. Accordingly, the base member 100_1 may include the first area SA, which may be a flat surface, and the third area or areas CA, which may be a bent portion or portions. As described above, the base member 100_1 may include an upper surface as one surface and a lower surface as the other surface in the third direction (Z-axis direction), and the other surface of the first area SA may be spaced apart from the third area CA to face the third area CA.

FIG. 20 illustrates a schematic cross-section across the first area SA and the third area CA of the cover glass 10_1 of FIG. 19. The first long side LS1 and the second long side LS2 of the cover glass 10_1 are illustrated in FIG. 19 as being bent downward, but the disclosure is not limited thereto. Accordingly, a first short side SS1 and a second short side SS2 of the cover glass 10_1 may be bent downward.

As illustrated in FIG. 20, according to an embodiment, a print layer 200_1 of the cover glass 10_1 may be disposed on a portion of the bent third area CA of the base member 100_1 that may face the other surface of the first area SA. A first print layer 210_1 of the print layer 200_1 may be disposed on a portion of the third area CA that may be spaced apart from and face the other surface of the first area SA, and a second print layer 220_1 may be disposed on the first print layer 210_1. For example, the print layer 200_1 may be disposed on a portion of the third area CA that may face the other surface of the first area SA. A light shielding area NDA of the cover glass 10_1 may be formed in an area in which the print layer 200_1 may be disposed, and a display area DA may be formed in the remaining area.

In the cover glass 10_1 according to an embodiment, since the light shielding area NDA may be formed in a portion of the third area CA that may be bent downward from the first area SA which may be a flat surface, the display area DA may be formed in a portion of the third area CA which may be a bent area. As illustrated in the drawings, the cover glass 10_1 may include a first display area DA1 formed in the first area SA, which may be a flat surface, and a second display area DA2 and a third display area DA3 formed in the bent third area CA. The cover glass 10_1 may include a first light shielding area NDA1 and a second light shielding area NDA2, which may be formed in an area of the third area CA facing the other surface of the first area SA and formed along the first long side LS1 and the second long side LS2, and a third light shielding area NDA3 and a fourth light shielding area NDA4, which may be formed along the first short side SS1 and the second short side SS2 across the first area SA and the third area CA. FIG. 20 illustrates a schematic cross-section across the first display area DA1, the second display area DA2, the third display area DA3, the first light shielding area NDA1, and the second light shielding area NDA2.

Even in the case of the cover glass 10_1 of FIGS. 19 and 20, as described above, the print layer 200 may be formed by performing the process of forming the ink layer 210', the process of removing a portion of the ink layer 210' to form the first print layer 210, and the process of forming the second print layer 220 on the first print layer 210. However, since the first print layer 210 may be disposed in the portion of the third area CA that may be spaced apart from and face the other surface of the first area SA, the process of exposing the ink layer 210' may be performed through a laser.

Figure 21:
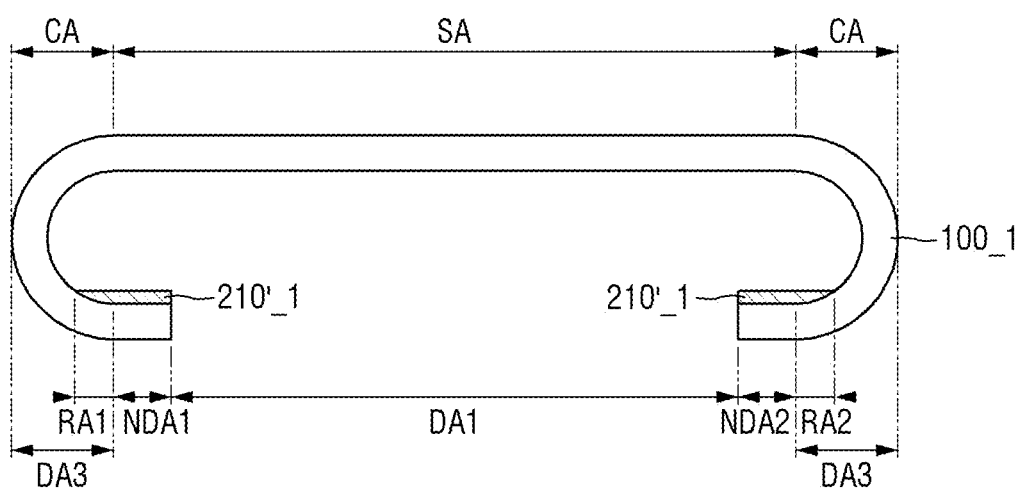
FIGS. 21 to 23 are schematic cross-sectional views illustrating a step or steps of the process of fabricating the cover glass according to an embodiment.
Figure 22:
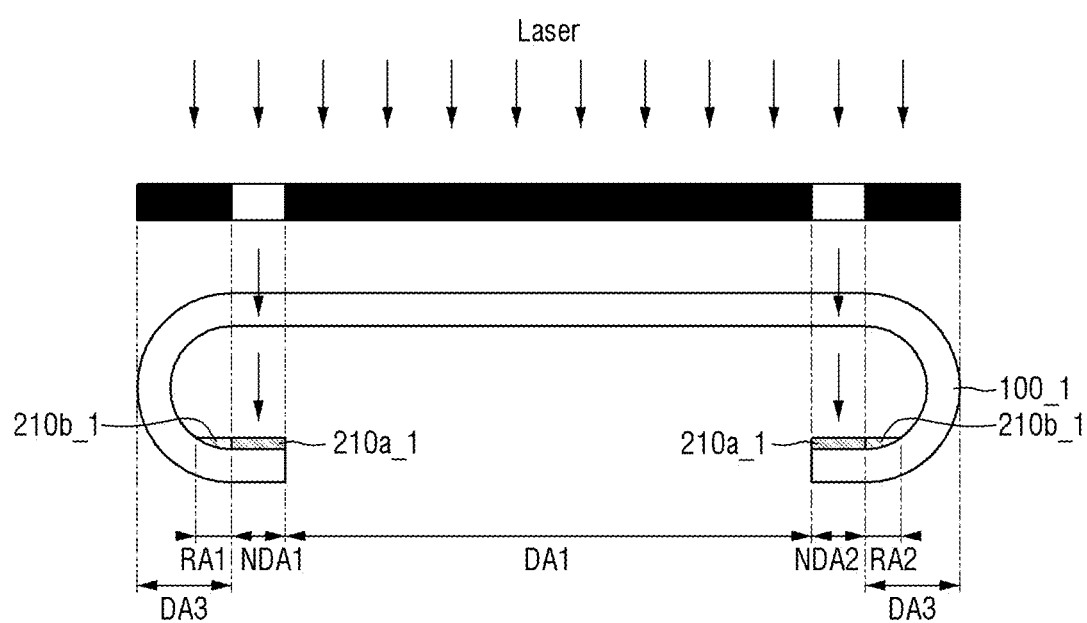
Figure 23:
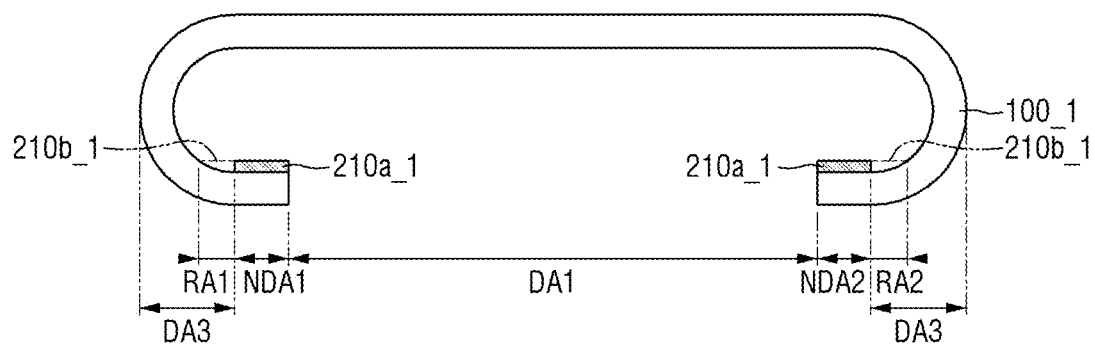

FIGS. 21 to 23 are schematic cross-sectional views illustrating a step or steps of the process of fabricating the cover glass according to an embodiment.

The process of fabricating the cover glass 10_1 of FIG. 19 will be described in detail with reference to FIGS. 21 to 23. As illustrated in FIG. 21, an ink layer 210'_1 may be formed on the third area CA of the base member 100_1. The process of forming the ink layer 210'_1 may be substantially the same as that described above. The ink layer 210'_1 may be formed with a width wider than that of the first print layer 210_1 and include a second portion 210b_1 disposed on removal areas RA1 and RA2.

Referring to FIG. 22, a process of exposing the second portion 210b_1 of the ink layer 210'_1 by irradiating the second portion 210b_1 with laser may be performed. Since, in the cover glass 10_1 of FIG. 19, the first print layer 210_1 may be disposed in the portion of the third area CA facing the other surface of the first area SA, light incident from the outside has to pass through the base member 100_1. Accordingly, unlike the embodiment illustrated in FIG. 7, in the embodiment illustrated in FIG. 22, the process of exposing the ink layer 210'_1 may be performed using a laser instead of a UV lamp or generally, UV light or a UV light source. In the case of the UV lamp, or generally, UV light or a UV light source, light may be scattered as the light passes through the base member 100_1, and, in this case, areas other than the removal areas RA1 and RA2 may also be irradiated with light, and a first portion 210a_1 of the ink layer 210'_1 may also be removed in a subsequent process. To prevent this, the exposure process may be performed using the laser in the method of fabricating the cover glass 10_1 according to an embodiment. The laser is illustrated in FIG. 22 as being irradiated toward the ink layer 210'_1 from an upper portion of one surface of the first area SA of the base member 100_1. However, the disclosure is not limited thereto.

As illustrated in FIG. 23, the second portion 210b_1 of the ink layer 210'_1 may be removed to form the first print layer 210_1. Since the subsequent processes may be the same as those described above, detailed descriptions thereof will be omitted.

Since, as described above, the print layer 200_1 may be disposed between the third area CA and the other surface of the first area SA of the base member 100_1 in the cover glass 10_1 of FIG. 19, the base member 100_1 may be disposed at an upper portion, a lower portion, and a side surface of the print layer 200_1. Accordingly, a light irradiation direction in an exposure process that may be performed in the process of removing the ink layer 210'_1 may be changed to various directions.

Figure 24:
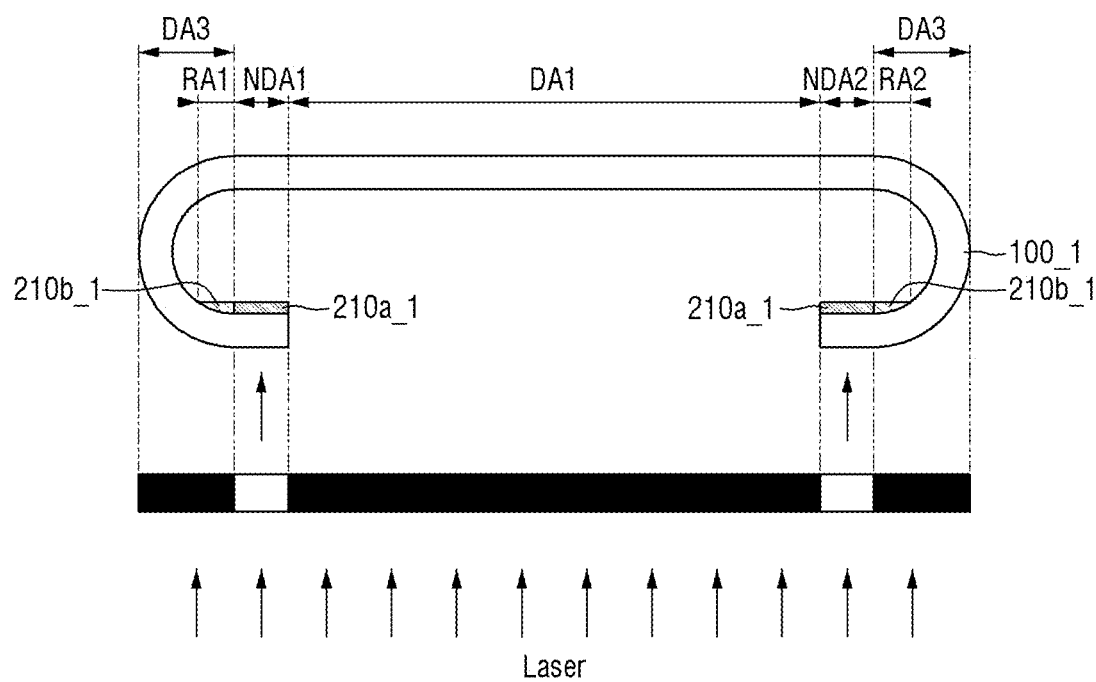
FIG. 24 is a schematic cross-sectional view illustrating a step or steps of the process of fabricating the cover glass according to an embodiment.

FIG. 24 is a schematic cross-sectional view illustrating a step of or steps of the process of fabricating the cover glass according to an embodiment.

Referring to FIG. 24, in a method of fabricating the cover glass 10_1 according to an embodiment, an exposure process that may be performed in a process of removing a portion of the ink layer 210'_1 may be performed by irradiating laser toward the ink layer 210'_1 from a lower portion of the opposite side of the third area CA that may face the other surface of the first area SA. Unlike the embodiment illustrated in FIG. 22, the laser with which the ink layer 210'_1 may be irradiated may be irradiated from the lower portion of the opposite side of the third area CA, for example, from a lower surface of the ink layer 210'_1. Except for this, the method may be the same as that described above.

Figure 25:
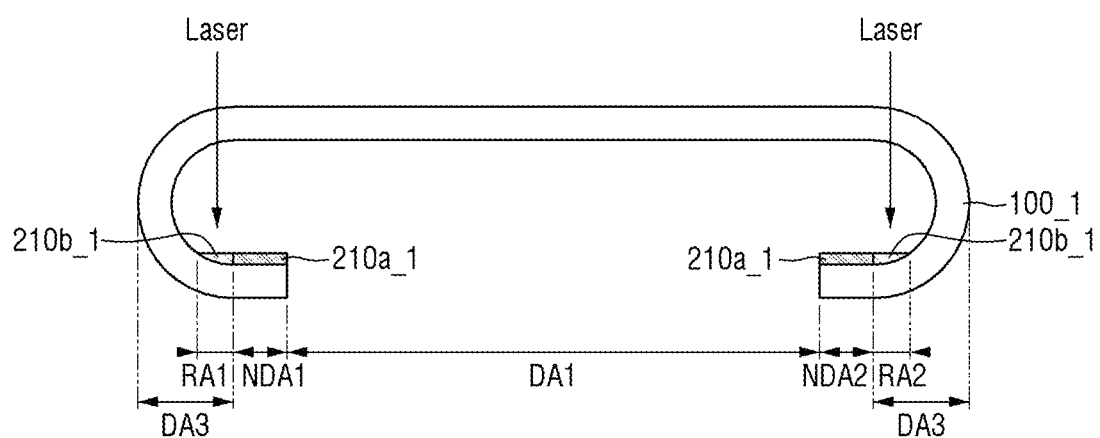
FIGS. 25 to 27 are schematic cross-sectional views illustrating a step or steps of the process of fabricating the cover glass according to an embodiment.
Figure 26:
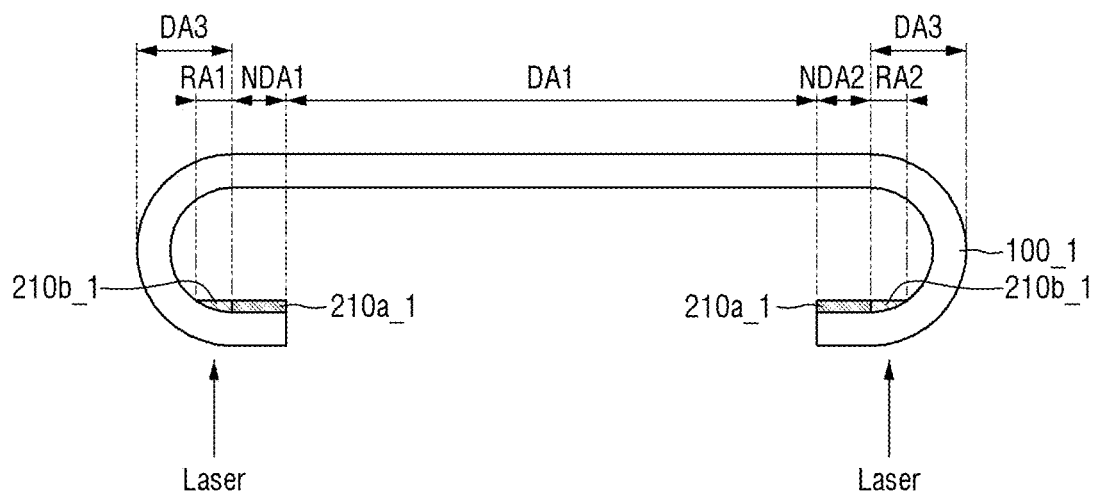
Figure 27:
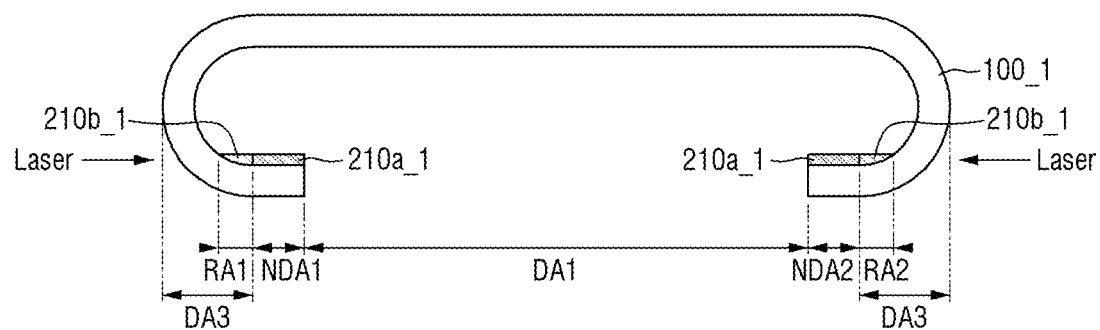

FIGS. 25 to 27 are schematic cross-sectional views illustrating a step or steps of the process of fabricating the cover glass according to an embodiment.

As described above, in the method of fabricating the cover glass 10_1, the process of removing a portion of the ink layer 210'_1 may be performed by a method in which the second portion 210b_1 of the ink layer 210'_1 may be directly irradiated with light to remove the second portion 210b_1. Referring to FIG. 25, the method of fabricating the cover glass 10_1 may include irradiating laser toward the ink layer 210'_1 from an upper portion of one surface of the first area SA to remove the second portion 210b_1 of the ink layer 210'_1. The process of removing the portion of the ink layer 210'_1 using the laser may be the same as that described above. In the cover glass 10_1 of FIG. 19, since the base member 100_1 may be disposed at an upper portion, a lower portion, and a side surface of the print layer 200_1, a direction in which the laser may be irradiated toward the ink layer 210'_1 may be changed to various directions.

Unlike in FIG. 25, referring to FIGS. 26 and 27, the laser irradiated toward the ink layer 210'_1 may be irradiated from a lower portion or a side surface of the ink layer 210'_1. FIG. 26 illustrates the case in which the laser may be irradiated from the lower portion of the ink layer 210'_1, and FIG. 27 illustrates the case in which the laser may be irradiated from the side surface of the ink layer 210'_1. Since detailed descriptions thereof may be substantially the same as those given above, the detailed descriptions will be omitted.

A method of fabricating a cover glass according to an embodiment may include, in a process of forming a print layer, a process in which a portion of an ink layer formed on one surface of a base member may be removed. The ink layer may be formed to have a width larger than that necessary for the print layer, and the print layer may be formed to have a desired width through the removal process. Accordingly, it may be possible to minimize an error in the print layer that may occur when the print layer may be formed through a process of transferring ink.

According to the disclosure, since a cover glass may be fabricated using the method, an error in a width of a light shielding area may be minimized, and the quality of the print layer may be improved.

In concluding the detailed description, those skilled in the art will appreciate that many variations and modifications may be made to the embodiments without substantially departing from the principles of the disclosure. Therefore, the disclosed embodiments are used in a generic and descriptive sense only and not for purposes of limitation.

What is claimed is:

1. A cover glass comprising:
 a base member including a first area and a second area adjacent to the first area, wherein a surface of the base member is substantially flat throughout the first area and a surface of the base member in the second area is inclined with respect to the surface of the base member in the first area;
 a first print layer disposed on the surface of the base member in the second area; and
 a second print layer disposed on the first print layer and spaced apart from a side surface of the first print layer, the side surface of the first print layer being adjacent to the first area, wherein
 at least part of the side surface of the first print layer is recessed by a recessed portion toward the second print layer, and
 the recessed portion being a void.

2. The cover glass of claim 1, wherein a width of the first print layer is larger than a width of the second print layer.

3. The cover glass of claim 1, wherein the at least part of the side surface of the first print layer includes a lower end portion that is inwardly recessed and in direct contact with the base member.

4. The cover glass of claim 1, wherein
 the first print layer and the second print layer extend along a side of the base member, and
 a side of the first print layer adjacent to the first area has a partially curved shape.

5. The cover glass of claim 1, wherein ink for the first print layer and the second print are applied by a pad technique and a portion of the first print layer and the second print layer are then removed.

6. The cover glass of claim 1, wherein the void is an empty space.

7. The cover glass of claim 1, wherein the first area corresponds to an image producing portion of a display device and the second area corresponds to a non-image producing portion of the display device.

8. A cover glass comprising:
 a base member including a first area and a second area adjacent to the first area, wherein a surface of the base member is substantially flat throughout the first area, and a surface of the base member in the second area is inclined with respect to the surface of the base member in the first area;
 a first print layer disposed on the surface of the base member in the second area; and
 a second print layer disposed on the first print layer and spaced apart from a side surface of the first print layer, the side surface of the first print layer being adjacent to the first area, wherein
 at least part of the side surface of the first print layer is recessed toward the second print layer, and
 a thickness of the first print layer is smaller than a thickness of the second print layer.

9. A cover glass comprising:
a base member including a first area and a third area adjacent to the first area, wherein a surface of the base member in the first area is substantially flat throughout the first area, and a surface of the base member in the third area is bent downward from the surface of the base member in the first area;
a first print layer disposed on the surface of the base member in the third area; and
a second print layer disposed on the first print layer and spaced apart from a side surface of the first print layer, the side surface of the first print layer being adjacent to the first area, wherein
at least part of the side surface of the first print layer is recessed toward the second print layer,
the surface of the base member in the first area faces the surface of the base member in the third area in a direction perpendicular to the surface of the base member in the first area, and
the first print layer faces the surface of the base member in the first area in the direction perpendicular to the surface of the base member in the first area.

10. The cover glass of claim 9, wherein a straight line parallel to a thickness direction of the base member in the first area passes through the base member twice at a location corresponding to the third area.

\* \* \* \* \*